United States Patent
Sotak et al.

(10) Patent No.: US 10,444,269 B2
(45) Date of Patent: Oct. 15, 2019

(54) APPARATUS AND METHOD FOR PERFORMING GRID ADAPTION IN NUMERICAL SOLUTION OF RECURSIVE BAYESIAN ESTIMATORS

(71) Applicant: Honeywell International Inc., Morris Plains, NJ (US)

(72) Inventors: Milos Sotak, Slavkov u Brna (CZ); Milos Vesely, Nemcice (CZ); Jindrich Dunik, Plzen (CZ)

(73) Assignee: Honeywell International Inc., Morris Plains, NJ (US)

( * ) Notice: Subject to any disclaimer, the term of this patent is extended or adjusted under 35 U.S.C. 154(b) by 267 days.

(21) Appl. No.: 15/606,764

(22) Filed: May 26, 2017

(65) Prior Publication Data
US 2018/0340965 A1    Nov. 29, 2018

(51) Int. Cl.
*G01R 29/08* (2006.01)
*G05B 17/02* (2006.01)
*H04B 17/318* (2015.01)
*G01S 3/78* (2006.01)

(52) U.S. Cl.
CPC ........ *G01R 29/0892* (2013.01); *G01S 3/7803* (2013.01); *G05B 17/02* (2013.01); *H04B 17/318* (2015.01)

(58) Field of Classification Search
CPC ...... H04B 17/318; G01S 3/7803; G05B 17/02
USPC ....................................................... 708/300
See application file for complete search history.

(56) References Cited

U.S. PATENT DOCUMENTS

| | | |
|---|---|---|
| 4,786,908 A | 11/1988 | Runnalls |
| 7,188,048 B2 | 3/2007 | Kouritzin et al. |
| 7,526,414 B2 | 4/2009 | Comaniciu et al. |
| 8,213,956 B2 | 7/2012 | Sirola et al. |
| 2004/0133927 A1* | 7/2004 | Sternberg ........... G06K 9/00624 725/136 |

(Continued)

FOREIGN PATENT DOCUMENTS

| | | |
|---|---|---|
| CN | 102737155 A | 10/2012 |
| EP | 1332336 | 10/2012 |

OTHER PUBLICATIONS

Yoo et al., "Improvement of Terrain Referenced Navigation using a Point Mass Filter with Grid Adaptation", International Journal of Control, Automation, and Systems (2015), Publisher ICROS, KIEE and Springer 2015, pp. 1173-1181.

(Continued)

*Primary Examiner* — Tan V Mai
(74) *Attorney, Agent, or Firm* — Fogg & Powers LLC

(57) ABSTRACT

A system is provided. The system comprises: a processing system comprising a memory coupled to a processor; wherein the processing system is configured to be coupled to at least one sensor; wherein the memory comprises a grid adaptation system, a system model, measurement data, and an estimation system; wherein the measurement data comprises data measured by the at least one sensor; wherein the estimation system is configured to provide probability density functions (PDFs) for a predictive estimate and a filtered estimate of a state in a form of a point-mass density; and wherein the grid adaption system is configured to adapt grid parameters of a predictive estimate and a filtered estimate.

10 Claims, 4 Drawing Sheets

(56) References Cited

U.S. PATENT DOCUMENTS

2015/0279031 A1   10/2015   Cavusoglu et al.
2016/0235270 A1   8/2016   Santini

OTHER PUBLICATIONS

Dunik et al., "Apparatus and Method for Data-Based Referenced Navigation", "U.S. Appl. No. 15/373,999", filed Dec. 9, 2016, pp. 1-32, Published in: US.
Anonsen et al., "Terrain Aided AUV Navigation—A Comparison of the Point Mass Filter and Terrain Contour Matching Algorithms", , pp. 1-10, Publisher: Norwegian Defence Research Establishment (FFI), Published in: Kjeller, Norway.
Niclas Bergman, "Bayesian Inference in Terrain Navigation", "Reglerteknik Automatic Control", 1997, pp. 1-98, Publisher: UniTryck Linkoping, Published in: Sweden.
Bergman et al., "Terrain Navigation Using Bayesian Statistics", "IEEE Control Systems", Jun. 1999, pp. 33-40, Publisher: IEEE.
Niclas Bergman, "Point-Mass Filter and Cramer-Rao Bound for Terrain-Aided Navigation", "Presented at CDC'97, 36th IEEE Conference on Decision and Control", Nov. 5, 1997, pp. 1-7, Publisher: IEEE.
Simandl et al., "Anticipative Grid Design in Point-Mass Approach to Nonlinear State Estimation", "IEEE Transactions on Automatic Control", Apr. 2002, pp. 699-702, vol. 47, No. 4, Publisher: IEEE.
European Patent Office, "Extended European Search Report for EP Application No. 18172212.5 dated Oct. 16, 2018", from Foreign Counterpart of U.S. Appl. No. 15/606,764, pp. 1-6, Published in: EP.

* cited by examiner

APPARATUS AND METHOD FOR PERFORMING GRID ADAPTION IN NUMERICAL SOLUTION OF RECURSIVE BAYESIAN ESTIMATORS

BACKGROUND

Recursive Bayesian estimators such as Kalman filters (KFs) are used to estimate an unknown probability density function (PDF) recursively. For example, extended Kalman filters are used to perform state estimation of non-linear systems. The KF-based estimators provide system state estimates in the form of the conditional moments on the basis of system model and measurements.

The filters cyclically perform two steps: the prediction step and the filtering step. If the estimation performance of the KF-based estimators is not sufficient, other estimators such as a point-mass filter (PMF) or a Rao-Blackwellized point-mass filter (RBPMF) can be used. These non-linear filters, which are based on the numerical solution to the Bayesian recursive relations (BRRs), provide state estimates in the form of the probability density functions (PDFs).

In the prediction step, the model of the non-linear system is used to predict (or to estimate) a future value of one or more states. In the filtering step, measurement data is used to correct the predictive estimate, and generates a filtered estimate of the states. The filtered estimate of the states is typically more accurate than the predictive estimate of the states because of the use of the measurement data.

The numerical solution based recursive Bayesian estimator is based on an approximation of a discrete probability density function using a point-mass density. Discrete PDFs, i.e., the point-mass densities, are formed over a grid of points, or an array of grid points. A probability is assigned to each grid point. While discrete PDFs are more readily analyzed with modern computers, they can give rise to approximation error.

The properties of the grid determine the accuracy of the numerical solution of the recursive Bayesian estimator. The properties include number of points, distance between the points, space (e.g. distance, area and volume), shape, and location of the grid.

Generally, the more grid points used, the more accurate the estimate provided by the Bayesian estimator. However, even with modern computation systems, the number of points that can be used is limited. Therefore, there is a need to enhance the accuracy of the Bayesian estimate other than by increasing the number of grid points.

SUMMARY

A system is provided. The system comprises: a processing system comprising a memory coupled to a processor; wherein the processing system is configured to be coupled to at least one sensor; wherein the memory comprises a grid adaptation system, a system model, measurement data, and an estimation system; wherein the measurement data comprises data measured by the at least one sensor; wherein the estimation system is configured to provide probability density functions (PDFs) for a predictive estimate and a filtered estimate of a state in a form of a point-mass density; and wherein the grid adaption system is configured to adapt grid parameters of a predictive estimate and a filtered estimate.

DRAWINGS

Understanding that the drawings depict only exemplary embodiments and are not therefore to be considered limiting in scope, the exemplary embodiments will be described with additional specificity and detail through the use of the accompanying drawings, in which.

In accordance with common practice, the various described features are not drawn to scale but are drawn to emphasize specific features relevant to the exemplary embodiments. Reference characters denote like elements throughout figures and text.

DETAILED DESCRIPTION

Figure 1:
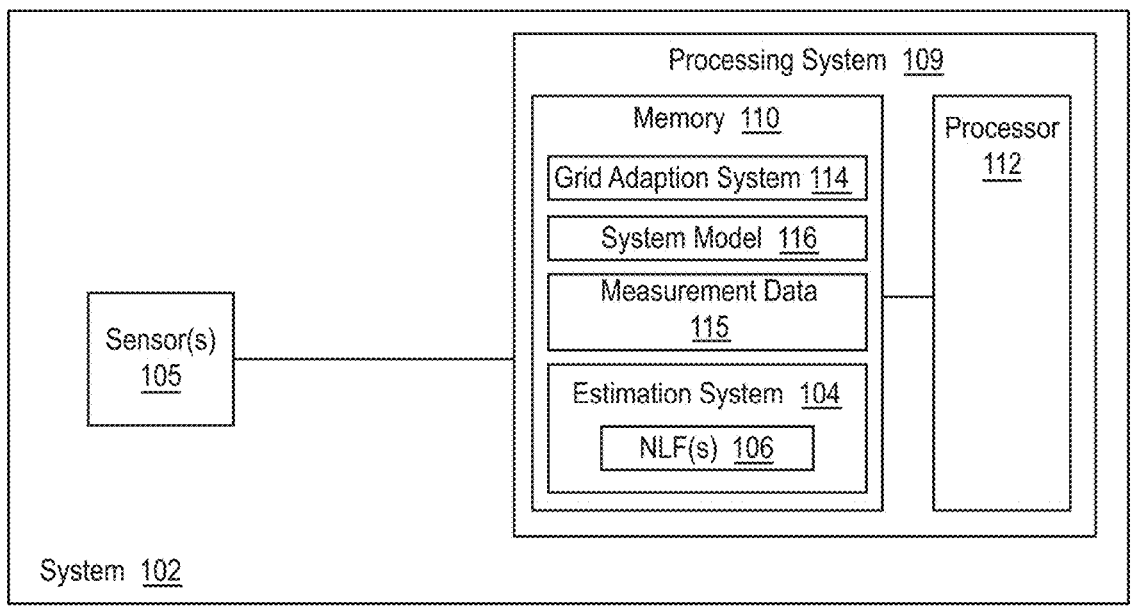
FIG. 1 illustrates one embodiment of a block diagram of a system configured to provide probability density functions of a state estimate.

In the following detailed description, reference is made to the accompanying drawings that form a part hereof, and in which is shown by way of illustration specific illustrative embodiments. However, it is to be understood that other embodiments may be utilized and that structural, mechanical, and electrical changes may be made. Furthermore, the method presented in the drawing figures and the specification is not to be construed as limiting the order in which the individual steps may be performed. The following detailed description is, therefore, not to be taken in a limiting sense.

In one embodiment, the invention uses a constant number of grid points while reducing approximation error. To accomplish this, in another embodiment, some properties of the grid change periodically. For example, such grid properties which may vary include the distance between the points, the space (e.g. distance, area and volume), the shape, and/or the location. Location, for example, is the location of reference point(s) of the grid, e.g. the center or corner of the grid.

FIG. 1 illustrates one embodiment of a block diagram of a system configured to provide probability density functions (PDFs) of the state estimate (System) 102. The system 102 comprises a processing system 109 coupled to an at least one sensor 105. The at least one sensor 105 measures data. In one example, the at least one sensor 105 may measure a quantity associated with a horizontal position on a known surface. In this embodiment, the one or more sensor 105 may include one or more of altimeters (e.g. barometric and/or radar), pressure sensors, accelerometers (e.g. measuring gravity), magnetometers, gravity gradiometers, gravimeters, water depth sensors, a bathymetric echo-sounder, a camera-type sensor, star trackers, and/or inertial measurement units including accelerometer(s) and/or gyroscope(s).

In one embodiment, the processing system 109 comprises a memory 110 coupled to a processor 112. In another embodiment, an estimation system 104, a grid adaptation system 114, measurement data 115, and a system model 116, having at least one model, are stored in the memory 110. In a further embodiment, other data is stored in the memory 110. The measurement data 115 is data measured by the at least one sensor 105. The grid adaptation system 114 and the system model 116 will be subsequently described.

In one embodiment, the grid adaptation system 114, the system model 116, the estimation system 104 may be stored in the form of executable software. In another embodiment, the grid adaptation system 114, the system model 116, the estimation system 104, and the measurement data are executed or processed by the processor 12. In a further embodiment, the processing system 109 may be a state machine or field programmable gate array.

In one embodiment, the estimation system 104 includes at least one non-linear filter (NLF(s)) configured to provide at least one state estimate PDF. Non-linear filters 106, configured to provide at least one state estimate PDF, can include one or more of particle filters, Gaussian sum filters, and point-mass filters. Point-mass filters include Rao-Blackwellized point-mass filters. Particle filters include Rao-Blackwellized particle filters. The estimation system 104 is also used to estimate state parameters of the system model 116, i.e. state-space models for a non-linear system, and thus provide a state estimate. In one embodiment, the state parameters include the horizontal position on the surface, and which is estimated based upon the system model 116, the measurement data 115, and the estimation system 104.

In one embodiment, the system model 116 includes without limitation a state space model in direct and/or indirect form. The state space model describes time-evolution of state parameters, e.g., of the horizontal position of an object, and/or of the error (e.g. bias, noise, or correlated noise) of the at least one sensor 105. In another embodiment, the state space model comprises a state equation that is linear and a measurement equation that is non-linear. In a further embodiment, the system model 116 is a state space model comprising a state equation and a measurement equation. The measurement equation relates directly unmeasurable state parameters with available measurements of the at least one sensor 105. Definition of the state variables, selection of the sensor measurements, and design of the state-space model is specified by a filter designer.

The following is an exemplary state-space model describing a non-linear system. The state-space model is in a form of a state equation (for $x_{k+1}$) and a measurement equation (for $z_k$):

$$x_{k+1} = f(x_k, u_k, w_k)$$

$$z_k = h(x_k) + v_k \quad \text{(Equation 1)}$$

where $x_k \in R^{n_x}$ is an unknown state, which is not directly measurable, at time instant k, $u_k \in R^{n_u}$ is a known input, $z_k \in R^{n_z}$ is a measurement parameter, $w_k \in R^{n_w}$ is a state noise with a known probability density function $p_w(w_k)$, $v_k \in R^{n_v}$ is a measurement noise with a known probability density function $p_v(v_k)$, and $f(\bullet)$ and $h(\bullet)$ are known functions which possible vary over time. Based upon the measurement equation, the measurement PDF can be computed from the state-space model measurement equation:

$$p(z_k|x_k^n) = p_v(z_k - h(x_k)) \quad \text{(Equation 2)}$$

The predictive estimate of the state $x_k$ at time k, computed using the state-space model and all measurements up to the time instant k−1, is described by a conditional PDF:

$$p(x_k|z^{k-1}) \quad \text{(Equation 3)}$$

where $z^{k-1} = [z_1, \ldots, z_{k-1}]$ represents all measurements up to the time instant k−1. The conditional PDF is provided by the estimation system 104.

If the PMF or RBPMF is considered to be a nonlinear filter, then a conditional PDF $p(x_k|z^l)$ is in the form of discretized point-mass PDF:

$$\hat{p}(x_k|z^l) = \sum_i P_{k|k-1}^{(i)}(\xi_k^{(i)}) S\{x_k : \xi_k^{(i)}, \Delta_x\} \cong p(x_k|z^l) \quad \text{(Equation 4)}$$

where $\xi_k^{(i)} \in R^{n_x}$ is the i-th grid point, i=1, 2, . . . , N, $P_{k|k-1}^{(i)}(\xi_k^{(i)})$ is the respective value of the conditional PDF at the grid point, $S\{x_k^n : \xi_k^{(i)}, \Delta_x\}$ is a piece-wise constant (grid point selection) function of variable $x_k$ at the grid point $\xi_k^{(i)}$ being one at the vicinity $\Delta_x$ of the point and zero otherwise. The point-mass PDF can be understood as the PDF computed at a set of discrete grid points approximation the support of the PDF $p(x_k|z^l)$. Thus, the estimation system 104 is configured to provide probability density functions (PDFs) for a predictive estimate and a filtered estimate of a state in a form of a point-mass density.

Figure 2:
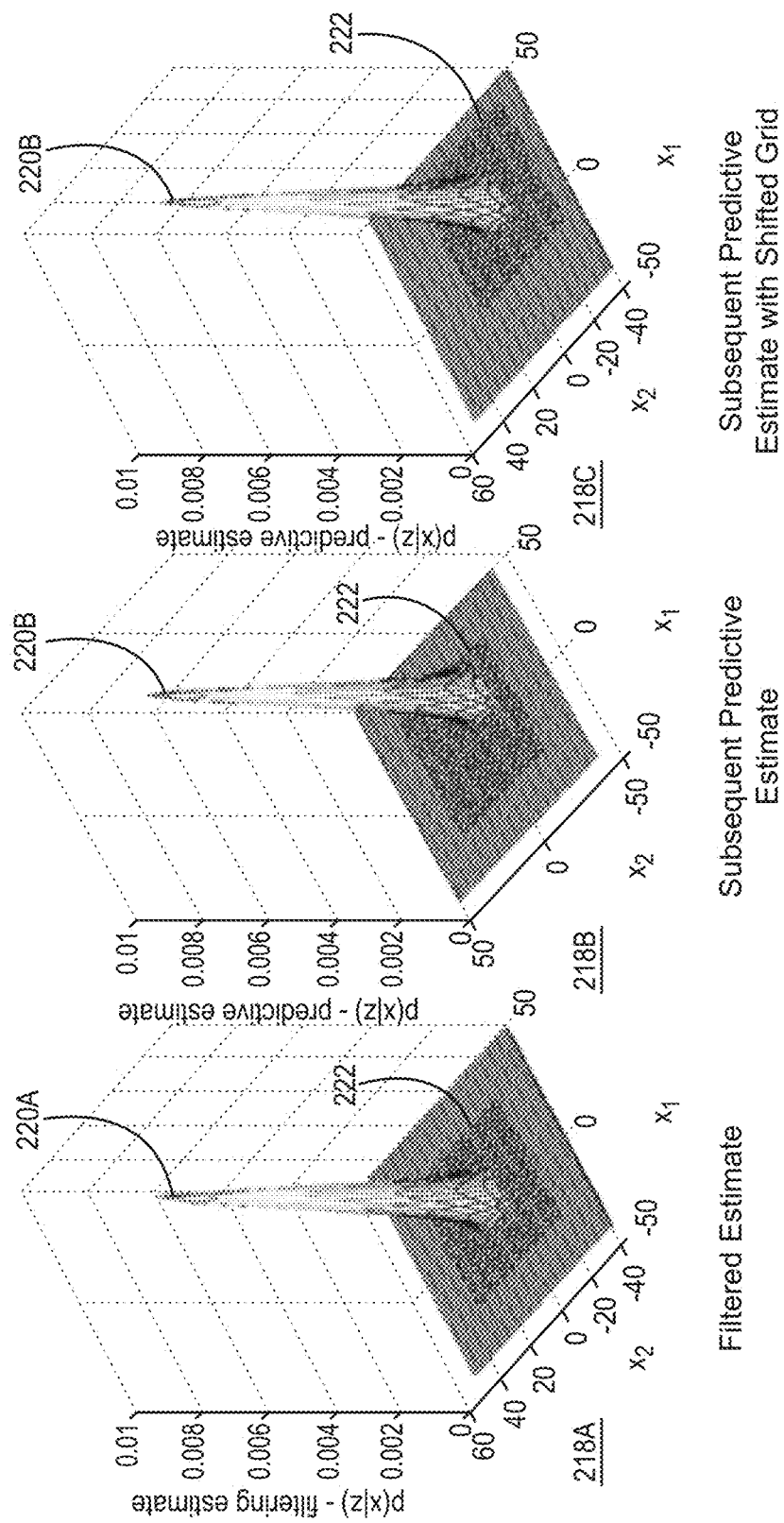
FIG. 2 illustrates one embodiment of discrete probability density functions for a filtered estimate, a subsequent predictive estimate, and a subsequent predictive estimate with a shifted grid.

Discrete (or point-mass) probability density functions and corresponding arrays of grid points will now be further discussed. FIG. 2 illustrates one embodiment of discrete probability density functions for a filtered estimate 218A, a subsequent predictive estimate 218B, and a subsequent predictive estimate with a shifted grid 218C. In this example, the discrete PDF 220A of the filtered estimate 218A substantially centered over an array of grid points 222. However, the location, e.g. the discrete PDF 220B of the subsequent predictive estimate 218B is displaced, or shifted, from the center of the array of grid points 222. As a result, some significant information of a PDF of the predictive estimate 102 may no longer be within the array of grid points 222. Therefore, as illustrated in the subsequent predictive estimate with shifted grid, the array of grid points is shifted in the $x_1$ and $x_2$ axes so that the discrete PDF 220B of the predictive estimate 218B is substantially centered over the array of grid points 222. In another embodiment, significant information of a PDF, which is contained in a significant portion of the PDF, is determined by one or more user defined thresholds. For example, for a probability ranging from zero to one, the user may define a threshold, e.g., of 0.01 so that the array of grid points 222 includes all discrete probabilities of the point-mass PDF associated with the grid points that are greater than, or are greater than or equal to 0.01. In a further embodiment, the user may define different thresholds for each axis.

Figure 3:
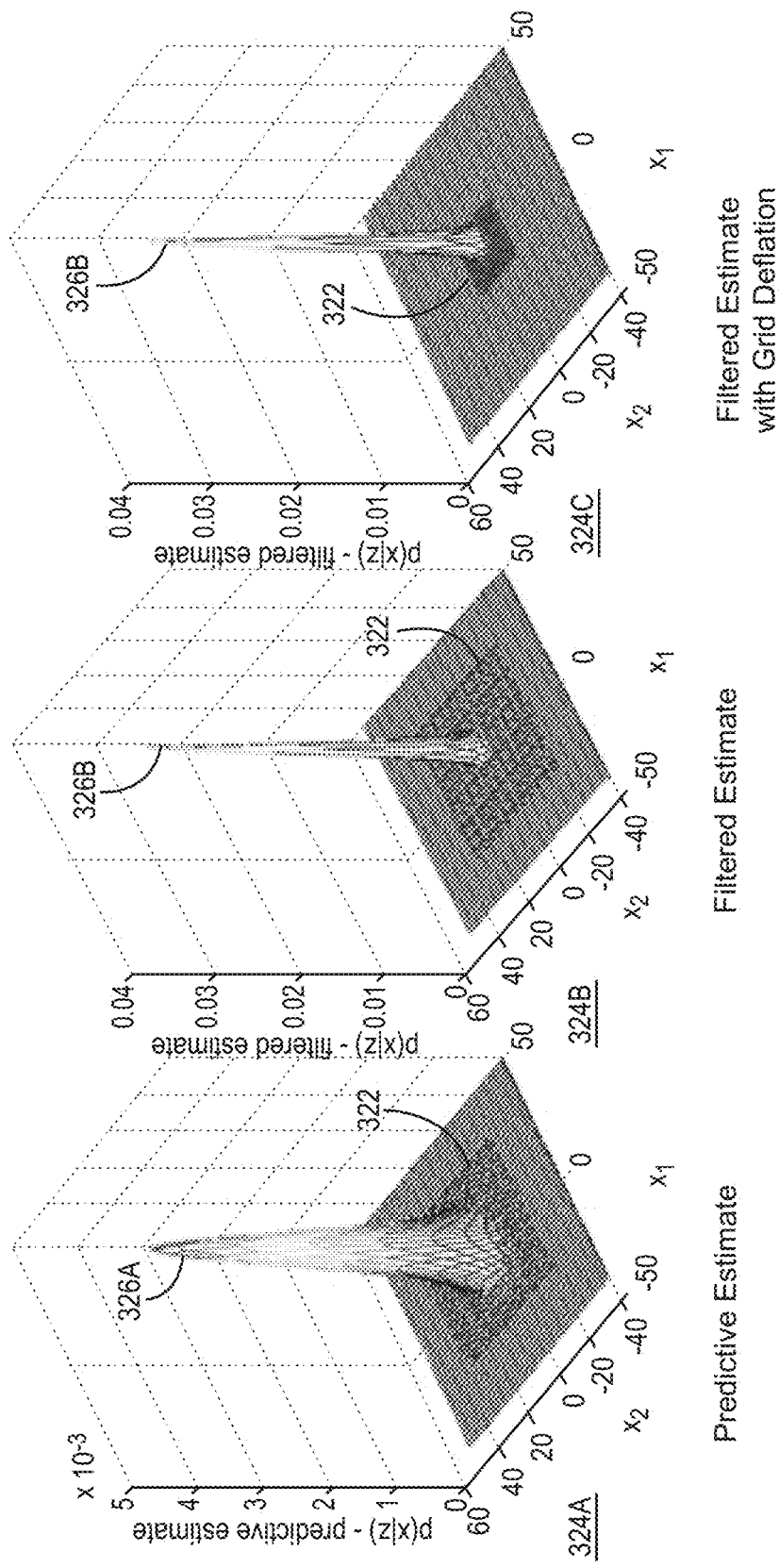
FIG. 3 illustrates one embodiment of discrete probability density functions for a predictive estimate, a subsequent filtered estimate, and a subsequent filtered estimate with a deflated grid.

The grid adaptation system 114 is configured to adapt grid parameters of predictive estimate and the filtered estimate. Illustration of exemplary high level functionality of the grid adaptation system 114 will now be described. FIG. 3 illustrates one embodiment of discrete probability density functions for a predictive estimate 324A, a subsequent filtered estimate 324B, and a subsequent filtered estimate with a deflated grid 324C. In this example, the discrete PDF 326A of the predictive estimate 324A substantially centered over an array of grid points 322. However, the shape, e.g. the discrete PDF 326B of the subsequent filtered estimate 324B changes becoming narrower. As a result, fewer grid points within the array of grid points 322 correspond to significant information about the discrete PDF 326B of the predictive estimate 324B. Therefore, as illustrated in the subsequent filtered estimate with grid deflation 324C, the array of grid points 322 is deflated, i.e. the distances between the points in the $x_1$ and/or $x_2$ axes are reduced so that substantially more grid points in the array of grid points 322 correspond to significant information about the discrete PDF 326B. When the array of grid points 322 is deflated, new grid points are inserted between existing grid points, and corresponding discrete PDF values must be interpolated for those new grid points. Such interpolation can be linear or nonlinear, and may result in points that are, or are not, spaced halfway between adjacent grid points; for example, non-linear interpolation may use second or higher order equations and account for neighboring grid points that are not adjacent to the interpolated grid point.

Alternatively, the shape of the discrete PDF may widen. As a result, the dimension(s) of the array of grid points must expanded to encompass the array of grid points 322 corresponding to significant information about the discrete PDF. Because the number of grid points is fixed, the array of grid points must be inflated, i.e. the distances between the points in the $x_1$ and/or $x_2$ axes are increased by decimation, or elimination of some existing grid points; new additional grid points are added.

The inflation and deflation techniques permit the most significant portion of the corresponding PDF to be analyzed, reducing error. These techniques are applicable to discrete PDFs of both predictive and filtered estimates. In one embodiment, techniques for inflating and deflating, and shifting the grid are implemented in the system 102, e.g. the grid adaption system 114, as will be further exemplified.

Figure 4:
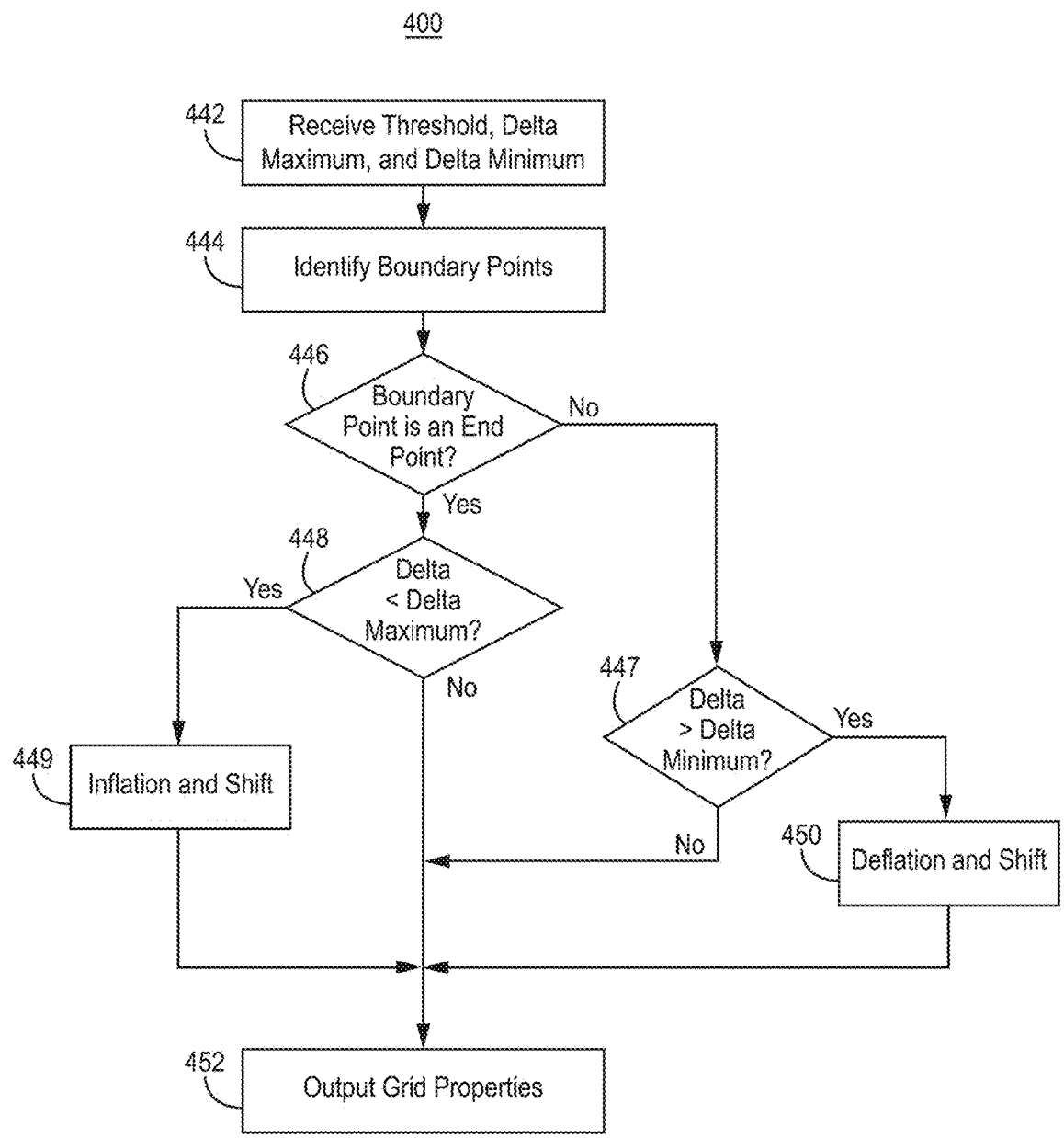
FIG. 4 illustrates one embodiment for performing adaptation for each grid axis.

One embodiment for implementing the grid adaptation system will now be described. FIG. 4 illustrates one embodiment for performing adaptation 400 for each grid axis. This process would be repeated for each grid axis. There may be one, two, or more grid axes.

To the extent that the embodiment of method 400 shown in FIG. 4 is described herein as being implemented in the systems shown in FIGS. 1 through 3, it is to be understood that other embodiments can be implemented in other ways. The blocks of the flow diagrams have been arranged in a generally sequential manner for ease of explanation; however, it is to be understood that this arrangement is merely exemplary, and it should be recognized that the processing associated with the methods (and the blocks shown in the Figure) can occur in a different order (for example, where at least some of the processing associated with the blocks is performed in parallel and/or in an event-driven manner).

In block 442, receive grid properties, e.g. grid properties of an axis of the grid. The grid properties for one axis include a reference point, a grid size, a delta, and/or an axis vector. The reference point is an arbitrary reference point along the axis. It can be a first, last or mid-point. The grid size is the number of points in the axis. The delta is the separation distance between each grid point. The axis vector is a list of each increment along the axis corresponding to each grid point is located. In lieu of the foregoing parameters for each axis, a grid vector can be provided identifying each grid point; information such as grid size, delta, and reference point can be derived from the grid vector. In another embodiment, the grid properties are defined by the prior step, filtered or predicted PDFs, or are provided by the user. In a further embodiment, the grid properties include a minimum delta (delta minimum) and a maximum delta (delta maximum), e.g. specified by the user; the minimum delta and the maximum delta limit the scope of expansion and contraction of the grid.

In block 442, receive a threshold, and a delta maximum and a delta minimum for the axis. The threshold defines the minimum probability that establishes the borders of the significant portion of the PDF.

In block 444, identify upper boundary point and lower boundary points on the axis based upon the at least one threshold. The upper boundary point and lower boundary point are points on the axis. In one embodiment, each boundary point defines an edge or support of the significant portion of the PDF. In another embodiment, each boundary point is a point on the axis corresponding to discrete probabilities that are less than, or are less than or equal to, the threshold.

In block 446, determine if either the upper boundary point or lower boundary point respectively correspond to the first grid point or last grid point in the axis. The first grid point and last grid point may be referred to hereafter collectively as end points and individually as an end point. If the upper boundary point and the lower boundary point does not respectively correspond to the first and last grid point in the axis, then, in block 447, determine if delta is greater than the delta minimum. If delta is not greater than the delta minimum then do not change the grid properties and, in one embodiment, proceed to block 452. In block 452, output the grid properties, e.g. reference point, grid size, delta, and/or axis vector, whether changed or not. In one embodiment, the outputted grid properties and the corresponding discrete PDF values of the corresponding grid are used to generate the next estimate, e.g. the predictive estimate or the filtered estimate.

If delta is greater than the delta minimum then proceed to block 450. In block 450, perform deflation and shift. If the discrete PDF is too narrow for the axis defined by the grid points, then perform deflation and shift which alters the grid properties by decreasing the distance between grid points and may shift the location of the reference point. Deflation and shift shall be exemplified subsequently in further detail. Then, proceed to block 452.

If the upper boundary point or the lower boundary point respectively corresponds to the first grid point or last grid point in the axis, then, in block 448, determine if delta is less than the delta maximum. If delta is not less than the delta maximum then do not change the grid properties and, in one embodiment, proceed to block 452. If delta is less than the delta maximum then proceed to block 449. In block 449, perform inflation and shift. If the discrete PDF is too broad for the axis defined by the grid points, then perform inflation and shift which alters the grid properties by increasing the distance between grid points and may shift the location of the reference point. Inflation and shift shall be exemplified subsequently in further detail. Then, proceed to block 452.

One embodiment of deflation and shift performed in block 450 shall now be exemplified. Calculate a new delta, reference point, and/or grid vector.

In one embodiment, this is accomplished as follows. Determine if either the upper boundary point (UpperPoint) or the lower boundary point (LowerPoint) respectively do not correspond to the last grid point and the first grid point, respectively. If both the upper boundary point (UpperPoint) and the lower boundary point (LowerPoint) respectively do not correspond to the first grid point and the last grid point, then:

$$\text{DeflationFactor}=(\text{GridSize}-\text{UpperPoint}-\text{LowerPoint}+2*\text{SafetyMargin}-1)/(\text{GridSize}-1);$$

$$\text{ReferencePointNew}=\text{ReferencePointOld}+\text{Delta}*(\text{LowerPoint}-1), \quad \text{(Equation 5)}$$

where deflation factor (DeflationFactor) is a scaling factor, GridSize is grid size, Delta is delta, and safety margin (SafetyMargin) is a user defined parameter that ensures that the significant portion of the PDF is within the deflated grid. The new reference point (ReferencePointNew) is a function of the prior reference point (ReferencePointOld).

If only the upper boundary point (UpperPoint) corresponds to the first grid point, then:

$$\text{DeflationFactor}=(\text{GridSize}-\text{UpperPoint}-\text{SafetyMargin})/(\text{GridSize}-1);$$

ReferencePointNew=ReferencePointOld (Equation 6)

The new reference point (ReferencePointNew) is a function of the prior reference point (ReferencePointOld).

If only the lower boundary point (LowerPoint) corresponds to the last grid point, then:

DeflationFactor=(GridSize−LowerPoint−SafetyMargin)/(GridSize−1);

ReferencePointNew=ReferencePointOld+Delta*(LowerPoint−1) (Equation 7)

The new reference point (ReferencePointNew) is a function of the prior reference point (ReferencePointOld).

Then, in one embodiment, the new delta (DeltaNew) is a function of the old delta (DeltaOld), and the axis vector (AxisVector) are determined by:

DeltaNew=DeltaOld*DeflationFactor;

AxisVector=ReferencePointNew+[1:(GridSize−1)]*DeltaNew (Equation 8)

[1:(GridSize−1)] means a set of points from a first point, represented by 1, to a last point represented by (GridSize−1).

One embodiment of inflation and shift performed in block 449 shall now be exemplified. Calculate a new delta, reference point, and/or grid vector.

In one embodiment, this is accomplished as follows. Determine if both the upper boundary point (UpperPoint) and the lower boundary point (LowerPoint) respectively correspond to the first grid point and the last grid point. If both the upper boundary point (UpperPoint) and the lower boundary point (LowerPoint) respectively correspond to the first grid point and the last grid point, then:

InflationFactor=(GridSize+UpperPoint+LowerPoint+2*SafetyMargin−1)/(GridSize−1);

ReferencePointNew=ReferencePointOld−Delta*LowerPoint, (Equation 9)

where inflation factor (InflationFactor) is a scaling factor, GridSize is grid size, Delta is delta, and safety margin (SafetyMargin) is a user defined parameter that ensures that the significant portion of the PDF is within the deflated grid. The new reference point (ReferencePointNew) is a function of the prior reference point (ReferencePointOld).

If only the upper boundary point (UpperPoint) corresponds to the first grid point, then:

InflationFactor=(GridSize+UpperPoint+SafetyMargin−1)/(GridSize−1);

ReferencePointNew=ReferencePointOld+Delta*UpperPoint/2. (Equation 10)

If only the lower boundary point (LowerPoint) corresponds to the last grid point, then:

InflationFactor=(GridSize+LowerPoint+SafetyMargin−1)/(GridSize−1);

ReferencePointNew=ReferencePointOld+Delta*Lower/2. (Equation 11)

The new reference point (ReferencePointNew) is a function of the prior reference point (ReferencePointOld).

Then, in one embodiment, the new delta (DeltaNew) is a function of the old delta (DeltaOld), and the axis vector (AxisVector) are determined by:

DeltaNew=DeltaOld*InflationFactor;

AxisVector=ReferencePoint+[1:(GridSize−1)]*DeltaNew (Equation 12)

Although specific embodiments have been illustrated and described herein, it will be appreciated by those of ordinary skill in the art that any arrangement, which is calculated to achieve the same purpose, may be substituted for the specific embodiments shown. Therefore, it is manifestly intended that this invention be limited only by the claims and the equivalents thereof.

EXAMPLE EMBODIMENTS

Example 1 is a system, comprising: a processing system comprising a memory coupled to a processor; wherein the processing system is configured to be coupled to at least one sensor; wherein the memory comprises a grid adaptation system, a system model, measurement data, and an estimation system; wherein the measurement data comprises data measured by the at least one sensor; wherein the estimation system is configured to provide probability density functions (PDFs) for a predictive estimate and a filtered estimate of a state in a form of a point-mass density; and wherein the grid adaption system is configured to adapt grid parameters of a predictive estimate and a filtered estimate.

Example 2 includes the system of Example 1, wherein the grid adaptation system is configured to perform the following for each axis of a grid after each estimate: receiving a threshold, a delta maximum, and a delta minimum; identifying an upper boundary point and a lower boundary point; determining if at least one boundary point is an end point of an axis; if the at least one boundary point is an end point of the axis, then determining if the delta is less than the delta maximum; if the delta is not less than the maximum, then not changing grid properties; if the delta is less than the delta maximum, then performing inflation and shift; if the at least one boundary point is not the end point of the axis, then determining if the delta is greater than the delta minimum; if the delta is not greater than the delta minimum, then not changing the grid properties; and if the delta is greater than the delta minimum, then performing deflation and shift.

Example 3 includes the system of any of Examples 1-2, wherein the grid adaptation system is further configured to perform, for the each axis of the grid after each estimate, outputting the grid properties to the estimation system.

Example 4 includes the system of any of Examples 1-3, further comprising receiving a safety margin; and wherein the performing deflation and shift comprises: determining if both the upper boundary point (UpperPoint) and the lower boundary point (LowerPoint) respectively do not correspond to a last grid point and a first grid point; if both the upper boundary point (UpperPoint) and the lower boundary point (LowerPoint) respectively do not correspond to the first grid point and the last grid point, then: DeflationFactor=(GridSize−UpperPoint−LowerPoint+2*SafetyMargin−1)/(GridSize−1), and ReferencePointNew=ReferencePointOld+Delta*(LowerPoint−1); if only the upper boundary point (UpperPoint) corresponds to the first grid point, then: DeflationFactor=(GridSize−UpperPoint−SafetyMargin)/(GridSize−1), and ReferencePointNew=ReferencePointOld; and if only the lower boundary point (LowerPoint) corresponds to the last grid point, then: DeflationFactor=(GridSize−LowerPoint−SafetyMargin)/(GridSize−1), and ReferencePointNew=ReferencePointOld+Delta*(LowerPoint−1); and DeltaNew=DeltaOld*DeflationFactor, and AxisVector=ReferencePointNew+[1:(GridSize−1)]*DeltaNew.

Example 5 includes the system of any of Examples 1-4, further comprising receiving a safety margin; and wherein the performing inflation and shift comprises: determining if both the upper boundary point (UpperPoint) and the lower boundary point (LowerPoint) respectively correspond to a first grid point and a last grid point; if both the upper boundary point (UpperPoint) and the lower boundary point (LowerPoint) respectively correspond to the first grid point and the last grid point, then: InflationFactor=(GridSize+UpperPoint+LowerPoint+2*SafetyMargin−1)/(GridSize−1), and ReferencePointNew=ReferencePointOld−Delta*LowerPoint; if only the upper boundary point (UpperPoint) corresponds to the first grid point, then: InflationFactor=(GridSize+UpperPoint+SafetyMargin−1)/(GridSize−1), and ReferencePointNew=ReferencePointOld+Delta*UpperPoint/2; and if only the lower boundary point (LowerPoint) corresponds to the last grid point, then: InflationFactor=(GridSize+LowerPoint+SafetyMargin−1)/(GridSize−1), and ReferencePointNew=ReferencePointOld+Delta*Lower/2; and DeltaNew=DeltaOld*InflationFactor, and AxisVector=ReferencePoint+[1:(GridSize−1)]*DeltaNew.

Example 6 includes the system of any of Examples 1-5, wherein the estimation system comprises at least one non-linear filter.

Example 7 includes the system of Example 6, wherein the at least one non-linear filter comprises at least one of a point-mass filter, a particle filter, and a Gaussian sum filter.

Example 8 includes the system of any of Examples 1-7, wherein the at least one sensor is configured to generate measurement data.

Example 9 includes the system of any of Examples 1-8, wherein the at least one sensor is configured to measure a quantity associated with a horizontal position on a known surface.

Example 10 includes the system of any of Examples 1-9, wherein the at least one sensor comprises at least one of: an altimeter, a pressure sensor, an accelerometer, a magnetometer, a gravity gradiometer, a gravimeter, a water depth sensor, a bathymetric echo-sounder, a camera-type sensor, a star tracker, an accelerometer, and a gyroscope.

Example 11 includes a method comprising, receiving a threshold, a delta maximum, and a delta minimum; identifying an upper boundary point and a lower boundary point; determining if at least one boundary point is an end point of an axis; if the at least one boundary point is an end point of the axis, then determining if delta is less than the delta maximum; if the delta is not less than the delta maximum, then not changing grid properties; if the delta is less than the delta maximum, then performing inflation and shift; if the at least one boundary point is not an end point of the axis, then determining if the delta is greater than the delta minimum; if the delta is not greater than the delta minimum, then not changing the grid properties; if the delta is greater than the delta minimum, then performing deflation and shift; and outputting the grid properties to the estimation system.

Example 12 includes the method of Example 11, further comprising receiving a safety margin; and wherein performing deflation and shift comprises: determining if both the upper boundary point (UpperPoint) and the lower boundary point (LowerPoint) respectively correspond to a first grid point and a last grid point; if both the upper boundary point (UpperPoint) and the lower boundary point (LowerPoint) respectively correspond to the first grid point and the last grid point, then: DeflationFactor=(GridSize−UpperPoint−LowerPoint+2*SafetyMargin−1)/(GridSize−1), and ReferencePointNew=ReferencePointOld+Delta*(LowerPoint−1); if only the upper boundary point (UpperPoint) corresponds to the first grid point, then: DeflationFactor=(GridSize−UpperPoint−SafetyMargin)/(GridSize−1), and ReferencePointNew=ReferencePointOld; and if only the lower boundary point (LowerPoint) corresponds to the last grid point, then: DeflationFactor=(GridSize−LowerPoint−SafetyMargin)/(GridSize−1), and ReferencePointNew=ReferencePointOld+Delta*(LowerPoint−1); and DeltaNew=DeltaOld*DeflationFactor, and AxisVector=ReferencePointNew+[1:(GridSize−1)]*DeltaNew.

Example 13 includes the method of any of Examples 11-12, further comprising receiving a safety margin; and performing inflation and shift comprises: determining if both the upper boundary point (UpperPoint) and the lower boundary point (LowerPoint) respectively correspond to a first grid point and a last grid point; if both the upper boundary point (UpperPoint) and the lower boundary point (LowerPoint) respectively correspond to the first grid point and the last grid point, then: InflationFactor=(GridSize+UpperPoint+LowerPoint+2*SafetyMargin−1)/(GridSize−1), and ReferencePointNew=ReferencePointOld−Delta*LowerPoint; if only the upper boundary point (UpperPoint) corresponds to the first grid point, then: InflationFactor=(GridSize+UpperPoint+SafetyMargin−1)/(GridSize−1), and ReferencePointNew=ReferencePointOld+Delta*UpperPoint/2; and if only the lower boundary point (LowerPoint) corresponds to the last grid point, then: InflationFactor=(GridSize+LowerPoint+SafetyMargin−1)/(GridSize−1), and ReferencePointNew=ReferencePointOld+Delta*Lower/2; and DeltaNew=DeltaOld*InflationFactor, and AxisVector=ReferencePoint+[1:(GridSize−1)]*DeltaNew.

Example 14 includes the method of any of Examples 11-13, wherein the outputting grid properties to the estimation system comprises outputting the grid properties to the estimation system comprising at least one non-linear filter.

Example 15 includes the method of Example 14, wherein outputting the grid properties to the estimation system comprising the at least one non-linear filter comprises outputting the grid properties to the estimation system comprising the at least one non-linear filter comprising at least one of a point-mass filter, a particle filter, and a Gaussian sum filter.

Example 16 includes A computer program product, comprising a non-transitory computer readable medium having computer readable program code embodied therein, said computer readable program code adapted to be executed to implement a method, said method comprising: receiving a threshold, a delta maximum, and a delta minimum; identifying an upper boundary point and a lower boundary point; determining if at least one boundary point is an end point of an axis; if the at least one boundary point is an end point of the axis, then determining if delta is less than delta maximum; if the delta is not less than the delta maximum, then not changing grid properties; if the delta is less than the delta maximum, then performing inflation and shift; if at least one boundary point is not an end point of the axis, then determining if the delta is greater than the delta minimum; if the delta is not greater than the delta minimum, then not changing the grid properties; if the delta is greater than the delta minimum, then performing deflation and shift; and outputting the grid properties to the estimation system.

Example 17 includes the computer program product of Example 16, further comprising receiving a safety margin; and performing deflation and shift comprises: determining if both the upper boundary point (UpperPoint) and the lower boundary point (LowerPoint) respectively correspond to a first grid point and a last grid point; if both the upper boundary point (UpperPoint) and the lower boundary point (LowerPoint) respectively correspond to the first grid point and the last grid point, then: DeflationFactor=(GridSize−UpperPoint−LowerPoint+2*SafetyMargin−1)/(GridSize−1), and ReferencePointNew=ReferencePointOld+Delta*(LowerPoint−1); if only the upper boundary point (UpperPoint) corresponds to the first grid point, then: DeflationFactor=(GridSize−UpperPoint−SafetyMargin)/(GridSize−1), and ReferencePointNew=ReferencePointOld; and if only the lower boundary point (LowerPoint) corresponds to the last grid point, then: DeflationFactor=(GridSize−LowerPoint−SafetyMargin)/(GridSize−1), and ReferencePointNew=ReferencePointOld+Delta*(LowerPoint−1); and DeltaNew=DeltaOld*DeflationFactor, and AxisVector=ReferencePointNew+[1:(GridSize−1)]*DeltaNew.

Example 18 includes the computer program product of any of Examples 16-17, further comprising receiving a safety margin; and performing inflation and shift comprises: determining if both the upper boundary point (UpperPoint) and the lower boundary point (LowerPoint) respectively correspond to a first grid point and a last grid point; if both the upper boundary point (UpperPoint) and the lower boundary point (LowerPoint) respectively correspond to the first grid point and the last grid point, then: InflationFactor=(GridSize+UpperPoint+LowerPoint+2*SafetyMargin−1)/(GridSize−1), and ReferencePointNew=ReferencePointOld−Delta*LowerPoint; if only the upper boundary point (UpperPoint) corresponds to the first grid point, then: InflationFactor=(GridSize+UpperPoint+SafetyMargin−1)/(GridSize−1), and ReferencePointNew=ReferencePointOld+Delta*UpperPoint/2; and if only the lower boundary point (LowerPoint) corresponds to the last grid point, then: InflationFactor=(GridSize+LowerPoint+SafetyMargin−1)/(GridSize−1), and ReferencePointNew=ReferencePointOld+Delta*Lower/2; and DeltaNew=DeltaOld*InflationFactor, and AxisVector=ReferencePoint+[1:(GridSize−1)]*DeltaNew.

Example 19 includes the computer program product of any of Examples 16-18, wherein outputting grid properties to the estimation system comprises outputting the grid properties to the estimation system comprising at least one non-linear filter.

Example 20 includes The computer program product of Example 19, wherein outputting the grid properties to the estimation system comprising at least one non-linear filter comprises outputting the grid properties to the estimation system comprising the at least one non-linear filter comprising at least one of a point-mass filter, a particle filter, and a Gaussian sum filter.

Although specific embodiments have been illustrated and described herein, it will be appreciated by those of ordinary skill in the art that any arrangement, which is calculated to achieve the same purpose, may be substituted for the specific embodiment shown. This application is intended to cover any adaptations or variations of the present invention. Therefore, it is manifestly intended that this invention be limited only by the claims and the equivalents thereof.

What is claimed is:

1. A system, comprising:
    a processing system comprising memory circuitry coupled to processor circuitry;
    wherein the processing system is configured to be coupled to at least one sensor;
    wherein the memory circuitry comprises a grid adaptation system, a system model, measurement data, and an estimation system;
    wherein the measurement data comprises data measured by the at least one sensor;
    wherein the processing system is configured to provide probability density functions (PDFs) for a predictive estimate and a filtered estimate of a horizontal position on a known surface in a form of a point-mass density; and
    wherein the processing system is further configured to adapt grid parameters of a predictive estimate and a filtered estimate.

2. The system of claim 1, wherein the processing system is further configured to perform the following for each axis of a grid after each estimate:
    receiving a threshold, a delta maximum, and a delta minimum;
    identifying an upper boundary point and a lower boundary point;
    determining if at least one boundary point is an end point of an axis;
    if the at least one boundary point is an end point of the axis, then determining if the delta is less than the delta maximum;
    if the delta is not less than the maximum, then not changing grid properties;
    if the delta is less than the delta maximum, then performing inflation and shift;
    if the at least one boundary point is not the end point of the axis, then determining if the delta is greater than the delta minimum;
    if the delta is not greater than the delta minimum, then not changing the grid properties; and
    if the delta is greater than the delta minimum, then performing deflation and shift.

3. The system of claim 1, wherein the processing system is further configured to perform, for the each axis of the grid after each estimate, outputting the grid properties to the estimation system.

4. The system of claim 1, wherein the processing system is further configured to receive a safety margin; and
    wherein the performing deflation and shift comprises:
        determining if both the upper boundary point (UpperPoint) and the lower boundary point (LowerPoint) respectively do not correspond to a last grid point and a first grid point;
        if both the upper boundary point (UpperPoint) and the lower boundary point (LowerPoint) respectively do not correspond to the first grid point and the last grid point, then:

DeflationFactor=(GridSize−UpperPoint−LowerPoint+2*SafetyMargin−1)/(GridSize−1), and ReferencePointNew=ReferencePointOld+Delta*(LowerPoint−1);

if only the upper boundary point (UpperPoint) corresponds to the first grid point, then:

DeflationFactor=(GridSize−UpperPoint−SafetyMargin)/(GridSize−1), and

ReferencePointNew=ReferencePointOld; and if only the lower boundary point (LowerPoint) corresponds to the last grid point, then:

DeflationFactor=(GridSize−LowerPoint−SafetyMargin)/(GridSize−1), and

ReferencePointNew=ReferencePointOld+Delta*(LowerPoint−1); and

DeltaNew=DeltaOld*DeflationFactor, and

AxisVector=ReferencePointNew+[1:(GridSize−1)]
*DeltaNew.

5. The system of claim 1, wherein the processing system is further configured to receive a safety margin; and
wherein the performing inflation and shift comprises:
determining if both the upper boundary point (UpperPoint) and the lower boundary point (LowerPoint) respectively correspond to a first grid point and a last grid point;
if both the upper boundary point (UpperPoint) and the lower boundary point (LowerPoint) respectively correspond to the first grid point and the last grid point, then:

InflationFactor=(GridSize+UpperPoint+LowerPoint+
2*SafetyMargin−1)/(GridSize−1), and ReferencePointNew=ReferencePointOld
Delta*LowerPoint;

if only the upper boundary point (UpperPoint) corresponds to the first grid point, then:

InflationFactor=(GridSize+UpperPoint+SafetyMargin−1)/(GridSize−1), and

ReferencePointNew=ReferencePointOld+
Delta*UpperPoint/2; and if only the lower boundary point (LowerPoint) corresponds to the last grid point, then:

InflationFactor=(GridSize+LowerPoint+SafetyMargin−1)/(GridSize−1), and

ReferencePointNew=ReferencePointOld+
Delta*Lower/2; and

DeltaNew=DeltaOld*InflationFactor, and

AxisVector=ReferencePoint+[1:(GridSize−1)]*DeltaNew.

6. The system of claim 1, wherein the estimation system comprises at least one non-linear filter.

7. The system of claim 6, wherein the at least one non-linear filter comprises at least one of a point-mass filter, a particle filter, and a Gaussian sum filter.

8. The system of claim 1, wherein the at least one sensor is configured to generate measurement data.

9. The system of claim 1, wherein the at least one sensor is configured to measure a quantity associated with the horizontal position on the known surface.

10. The system of claim 1, wherein the at least one sensor comprises at least one of: an altimeter, a pressure sensor, an accelerometer, a magnetometer, a gravity gradiometer, a gravimeter, a water depth sensor, a bathymetric echo-sounder, a camera-type sensor, a star tracker, an accelerometer, and a gyroscope.

* * * * *

UNITED STATES PATENT AND TRADEMARK OFFICE
CERTIFICATE OF CORRECTION

PATENT NO. : 10,444,269 B2
APPLICATION NO. : 15/606764
DATED : October 15, 2019
INVENTOR(S) : Milos Sotak, Milos Vesely and Jindrich Dunik Page 1 of 1

It is certified that error appears in the above-identified patent and that said Letters Patent is hereby corrected as shown below:

In the Claims

At Column 13, Claim 5, Lines 18-19, replace "ReferencePointOld Delta" with --ReferencePointOld – Delta--

Signed and Sealed this
Twenty-fourth Day of December, 2019

Andrei Iancu
*Director of the United States Patent and Trademark Office*